(12) United States Patent
Storer et al.

(10) Patent No.: US 7,736,438 B2
(45) Date of Patent: Jun. 15, 2010

(54) METHOD AND APPARATUS FOR DEPOSITING A COATING ON A TAPE CARRIER

(75) Inventors: Jonathan Storer, Los Alamos, NM (US); Vladimir Matias, Santa Fe, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 1050 days.

(21) Appl. No.: 11/443,808

(22) Filed: May 31, 2006

(65) Prior Publication Data

US 2006/0275548 A1     Dec. 7, 2006

Related U.S. Application Data

(60) Provisional application No. 60/686,251, filed on Jun. 1, 2005.

(51) Int. Cl.
C23C 16/00     (2006.01)
C23C 14/00     (2006.01)

(52) U.S. Cl. .................................. 118/718; 204/298.24

(58) Field of Classification Search ................. 118/718, 118/719; 204/298.24
See application file for complete search history.

(56) References Cited

U.S. PATENT DOCUMENTS 4,013,539 A * 3/1977 Kuehnle ................. 204/298.24
4,301,765 A * 11/1981 Behn et al. .................. 118/718
5,951,835 A * 9/1999 Namiki et al. ......... 204/298.24
6,083,355 A * 7/2000 Spence ........................ 204/164
6,367,411 B2 * 4/2002 Ogawa et al. ....... 118/723 MW

FOREIGN PATENT DOCUMENTS

JP    06088235 A  *  3/1994
JP    08041645 A  *  2/1996

* cited by examiner

*Primary Examiner*—Karla Moore
(74) *Attorney, Agent, or Firm*—Robert P. Santandrea; Samuel L. Borkowsky

(57) ABSTRACT

A system and method for depositing ceramic materials, such as nitrides and oxides, including high temperature superconducting oxides on a tape substrate. The system includes a tape support assembly that comprises a rotatable drum. The rotatable drum supports at least one tape substrate axially disposed on the surface of the drum during the deposition of metals on the tape and subsequent oxidation to form the ceramic materials. The drum is located within a stator having a slot that is axially aligned with the drum. A space exists between the drum and stator. The space is filled with a predetermined partial pressure of a reactive gas. The drum, stator, and space are heated to a predetermined temperature. To form the ceramic material on the tape substrate, the drum is first rotated to align the tape substrate with the slot, and at least one metal is deposited on the substrate. The drum then continues to rotate, bringing the tape substrate into the space, where the metal deposited on the tape substrate reacts with the reactive gas to form the ceramic material. In one embodiment, the tape support system also includes a pay-out/take-up system that co-rotates with the drum and provides a continuous length of tape substrate.

27 Claims, 11 Drawing Sheets

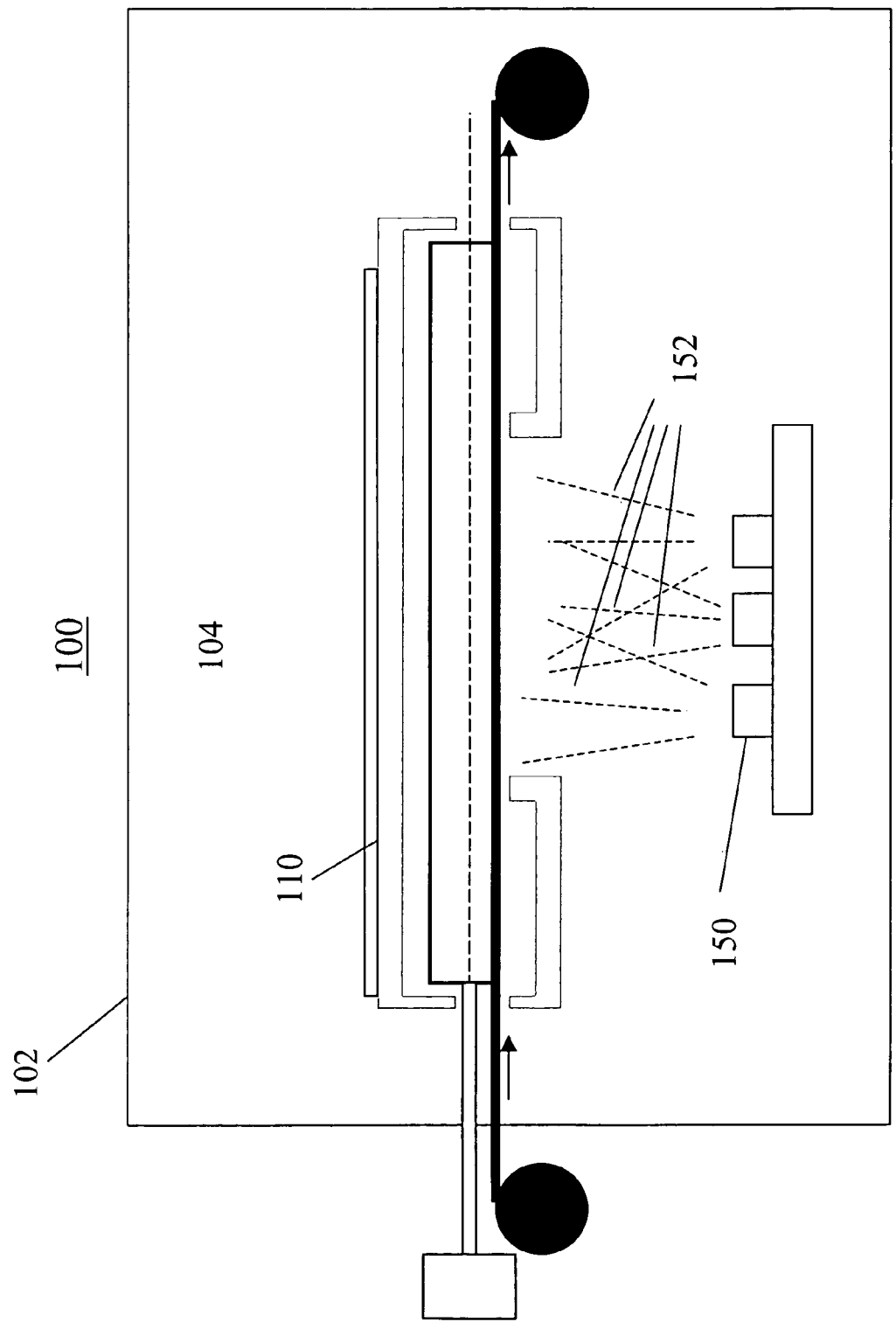

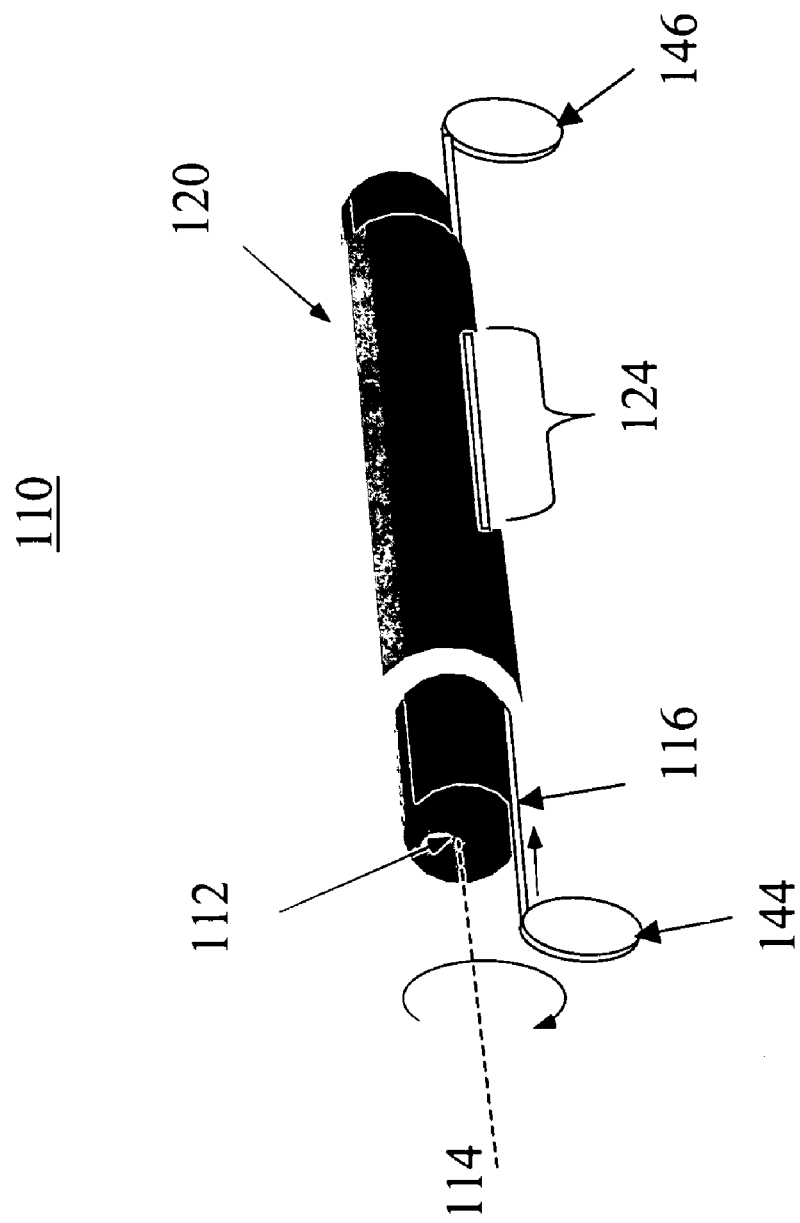

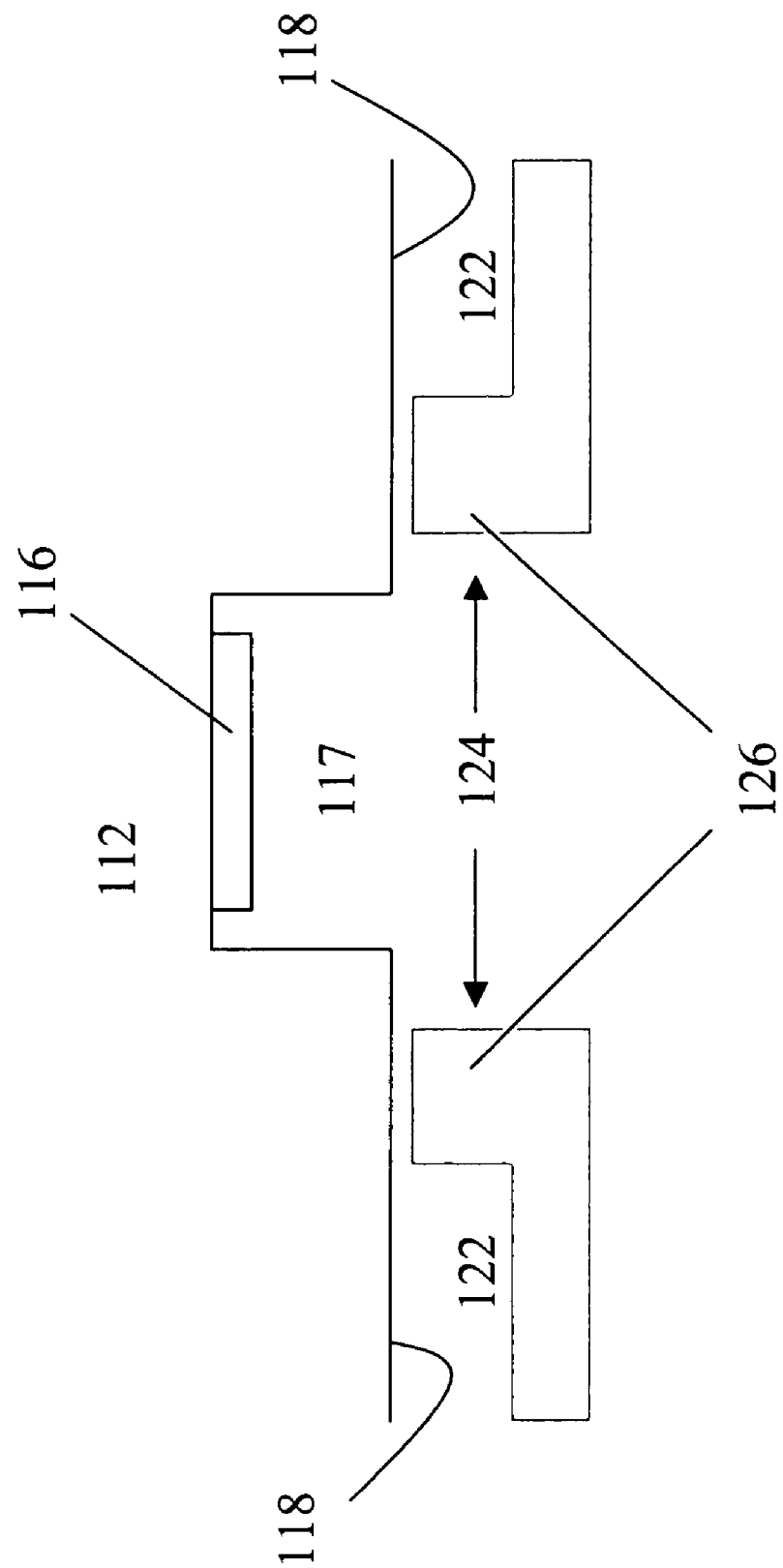

FIG. 8

| | | | |
|---|---|---|---|
| Diameter (cm) | 15 | 150 | 150 |
| Circumference (cm) | 47.1 | 471.2 | 471.2 |
| Number of 1 cm. Paths | 20 | 250 | 250 |
| Rotation speed (Hz) | 5 | 2 | 2 |
| Deposition zone width (cm) | 4 | 25 | 25 |
| Deposition zone length (cm) | 15 | 100 | 100 |
| Deposition per revolution (Å) | 2 | 2 | 6 |
| Deposition rate (Å/sec) | 118 | 75 | 226 |
| Deposit per pass (μm) | 1 | 1 | 1 |
| Individual tape speed (cm/sec) | 0.015 | 0.04 | 0.12 |
| Combined effective speed (cm-m/hr) | 11 | 360 | 1080 |

METHOD AND APPARATUS FOR DEPOSITING A COATING ON A TAPE CARRIER

REFERENCE TO PRIOR APPLICATION

This application claims the benefit of U.S. Provisional Application No. 60/686,251, filed Jun. 1, 2005.

STATEMENT REGARDING FEDERAL RIGHTS

This invention was made with government support under Contract No. W-7405-ENG-36, awarded by the U.S. Department of Energy. The government has certain rights in the invention.

BACKGROUND OF INVENTION

The invention relates to forming a ceramic coating on a tape substrate. More particularly, the invention relates to an apparatus and method for converting a metal deposit on a tape substrate to a ceramic, such as an oxide or a nitride. Even more particularly, the invention relates to an apparatus and method of forming a high temperature superconducting oxide on a tape substrate.

The formation of ceramic materials such as oxides, nitrides, and the like on a tape substrate is of particular interest, particularly in the filed of power generation and distribution. High temperature superconducting (HTS) oxides fall within this class of materials, and are being incorporated into silver-based tapes for use in motors, generators, and power transmission lines.

Several methods are currently being used to deposit HTS coatings. These include metallorganic-based liquid deposition techniques; evaporative techniques, including thermal (resistance or induction) and electron beam evaporation; vaporization by pulsed lasers; and metallorganic chemical vapor deposition (MOCVD). Of these methods, evaporative methods are particularly desirable because they offer a potentially high throughput and, therefore, scalable technology with broad area deposition and high rate of film formation.

One inherent drawback in evaporation, relates to the phase stability of the HTS material itself. To obtain the desired superconducting layered perovskite structure having a high degree of crystalline texture, an atmosphere with sufficiently high oxygen partial pressure ($PO_2$) is needed. A high oxygen partial pressure, however, is not compatible with evaporative processes.

One approach to this problem is to expose the substrate alternately to a high $PO_2$ region (referred to as the "oxygen pocket") where HTS stability is established, and a low $PO_2$ region where evaporation is used to deposit the metal constituents of the HTS material. This may be accomplished by first depositing the metal constituents and then transferring the coated substrate through a separate furnace for oxygen annealing. In another variation, the substrate is translated back and forth between the oxygen pocket and the low $PO_2$ region. However, the latter method is unable to coat substrates—such as tapes, wire, and ribbons—having one dimension (length) that is many times greater that the other two dimensions and much larger than the apparatus itself.

To overcome the dimensional problem, a tape substrate is helically wound around a single mandrel and sections of the resulting spiral arrangement are alternately passed through the oxygen pocket and the low $PO_2$ region. While this technique allows for a greater length of tape substrate to be coated, the length of the tape substrate is essentially limited by the size of the mandrel. Therefore, a very large mandrel is necessary to manufacture lengths of tape needed for many power generation and motor applications. In addition, the tape tends to creep and set because it is helically wound around the mandrel, making the tape unacceptable for some applications.

Another variation employs spiraling the tape around multiple reels or rollers to provide a continuous feed of tape in conjunction with a movable oxygen pocket. When a portion of the tape substrate is the vicinity of the oxygen pocket, the tape is not necessarily in thermal equilibrium, as the radiative properties of the tape change during deposition.

The length of HTS tape that can currently be manufactured in limited in part by the dimensions of the manufacturing equipment. In addition, it is difficult to maintain thermal equilibrium of the tape substrate during the oxygenation process. Therefore, what is needed in an apparatus that allows a high temperature superconductor to be deposited on long, continuous lengths of tape substrate. What is also needed is an apparatus that is capable of maintaining the tape substrate in thermal equilibrium during the deposition process.

SUMMARY OF INVENTION

The present invention meets these and other needs by providing a system and method for depositing ceramic materials, such as oxides, nitrides, carbides, sulfide, and the like on a tape substrate. The system includes a tape support assembly that comprises a rotatable drum that supports at least one tape substrate axially disposed on the surface of the drum during the deposition of metals on the tape and subsequent oxidation to form the ceramic materials. The drum is located within a stator having a slot that is axially aligned with the drum. A space exists between the drum and stator. The space is filled with a predetermined partial pressure of a reactive gas. The drum, stator, and space are heated to a predetermined temperature. To form the ceramic material on the tape substrate, the drum is first rotated to align the tape substrate with the slot and at least one metal is deposited on the substrate. The drum then continues to rotate, bringing the tape substrate into the space, where the metal deposited on the tape substrate reacts with the reactive gas to form the ceramic material. In one embodiment, the tape support system also includes a pay-out/take-up system that co-rotates with the drum and provides a continuous length of tape substrate to the tape support assembly and drum.

Accordingly, one aspect of the invention is to provide a system for coating a tape substrate with a ceramic material. The system comprises: a vessel defining a vacuum chamber therein, wherein the vessel maintains the vacuum chamber at a pressure of less than $10^{-3}$ Torr; a tape support assembly at least partially disposed within the vessel; and at least one metal vapor source disposed in the vacuum chamber. The tape support assembly comprises: a drum rotatable about a longitudinal axis and an annular stator, wherein the drum is disposed within the annular stator so as to create a space between the annular stator and the drum; at least one gas source, wherein the at least one gas source is in fluid communication with the space, wherein the gas source provides at least one reactive gas to the space; at least one heating element disposed in at least one of the drum, the annular stator, and the space, wherein the at least one heating element heats the at least one tape and gases within the space; and a rotor drive coupled to the drum, wherein the rotor drive rotates the drum at a predetermined speed. The drum is adapted to support at least one tape substrate axially disposed against a surface of the drum. The annular stator comprises: at least one slot cut therethrough, wherein the slot is axially aligned with the drum; a lip seal disposed around the edge of the slot and an end seal disposed at each end of the annular stator to allow the space to be maintained at a pressure that is greater than the pressure in the chamber. The at least one metal vapor source provides a metal vapor through the slot to the at least one tape substrate supported by the drum.

Another aspect of the invention is to provide a tape support assembly for converting a metal coating on a tape substrate to a ceramic material, the tape support assembly comprises: a drum rotatable about a longitudinal axis, wherein the drum is adapted to support at least one tape substrate axially disposed against a surface of the drum; an annular stator, wherein the drum is disposed within the annular stator so as to create a space between the annular stator and the drum, the annular stator comprising: at least one slot cut therethrough, wherein the slot is axially aligned with the drum; a lip seal disposed around the edge of the slot and an end seal disposed at each end of the annular stator to allow the space to be maintained at a pressure that is greater than a pressure outside the annular stator; at least one gas source, wherein the at least one gas source is in fluid communication with the space, wherein the gas source provides at least one reactive gas to the space; at least one heating element disposed in at least one of the drum, the annular stator, and the pocket, wherein the at least one heating element heats the at least one tape and gases within the space; and a rotor drive coupled to the drum, wherein the rotor drive rotates the drum at a predetermined speed.

Yet another aspect of the invention is to provide a system for coating a tape substrate with a ceramic material. The system comprises: a vessel defining a vacuum chamber therein, wherein the vessel maintains the vacuum chamber at a pressure of less than $10^{-3}$ Torr; a tape support assembly at least partially disposed within the vessel; and at least one metal vapor source disposed in the vacuum chamber. The tape support assembly comprises: a drum rotatable about a longitudinal axis and an annular stator, wherein the drum is disposed within the annular stator so as to create a space between the annular stator and the drum; at least one oxygen source, wherein the at least one oxygen source is in fluid communication with the space, wherein the at least one oxygen source provides oxygen to the space; at least one heating element disposed in at least one of the drum, the annular stator, and the space, wherein the at least one heating element heats the at least one tape and gases within the space; a rotor drive coupled to the drum, wherein the rotor drive rotates the drum at a predetermined speed; and a take-up/pay-out assembly coupled to the drum, wherein the take-up/pay-out assembly is co-rotatable with the drum, and wherein the take-up/pay-out assembly moves the at least one tape substrate in a direction perpendicular to a direction of rotation of the drum. The drum is adapted to support at least one tape substrate axially disposed against a surface of the drum. The annular stator comprises: at least one slot cut therethrough, wherein the slot is axially aligned with the drum; a lip seal disposed around the edge of the slot and an end seal disposed at each end of the annular stator to allow the space to be maintained at a pressure that is greater than the pressure in the chamber. The at least one metal vapor source provides a metal vapor through the slot to the at least one tape substrate supported by the drum.

A further aspect of the invention is to provide a method of making one of a metal oxide and a metal nitride on a tape substrate. The method comprises the steps of: providing at least one tape substrate; disposing the tape substrate on a drum, wherein the tape substrate is disposed so that its length is parallel to a longitudinal axis of rotation of the drum; wherein the drum is disposed within a stator comprising a slot, the slot having a long dimension that is parallel to the longitudinal axis of rotation of the drum, wherein the drum is located within the stator to form a space between the drum and stator; providing a predetermined pressure of one of nitrogen and oxygen to the space; heating the tape substrate and the space to a predetermined temperature; providing at least one metal vapor to the slot; aligning the tape substrate with the slot to expose the tape substrate to the at least one metal vapor in the slot; depositing the at least one metal on the tape substrate; rotating the drum to bring the tape substrate out of alignment with the slot and into the space in which one of nitrogen and oxygen is present; and reacting one of nitrogen and oxygen with the at least one metal deposited on the tape substrate to form one of the metal nitride and the metal oxide.

These and other aspects, advantages, and salient features of the present invention will become apparent from the following detailed description, the accompanying drawings, and the appended claims.

DESCRIPTION OF THE DRAWINGS

FIG. 1 is a schematic representation of a system for coating a tape substrate;

FIG. 2b is a perspective view the tape support assembly shown in FIG. 2a;

FIG. 6a is a schematic cross-sectional view of a tape substrate disposed in a rectangular groove of a drum of the tape support assembly;

FIG. 8 is a table showing expected operational parameters and outputs for the present invention.

DETAILED DESCRIPTION

Figure 2A:
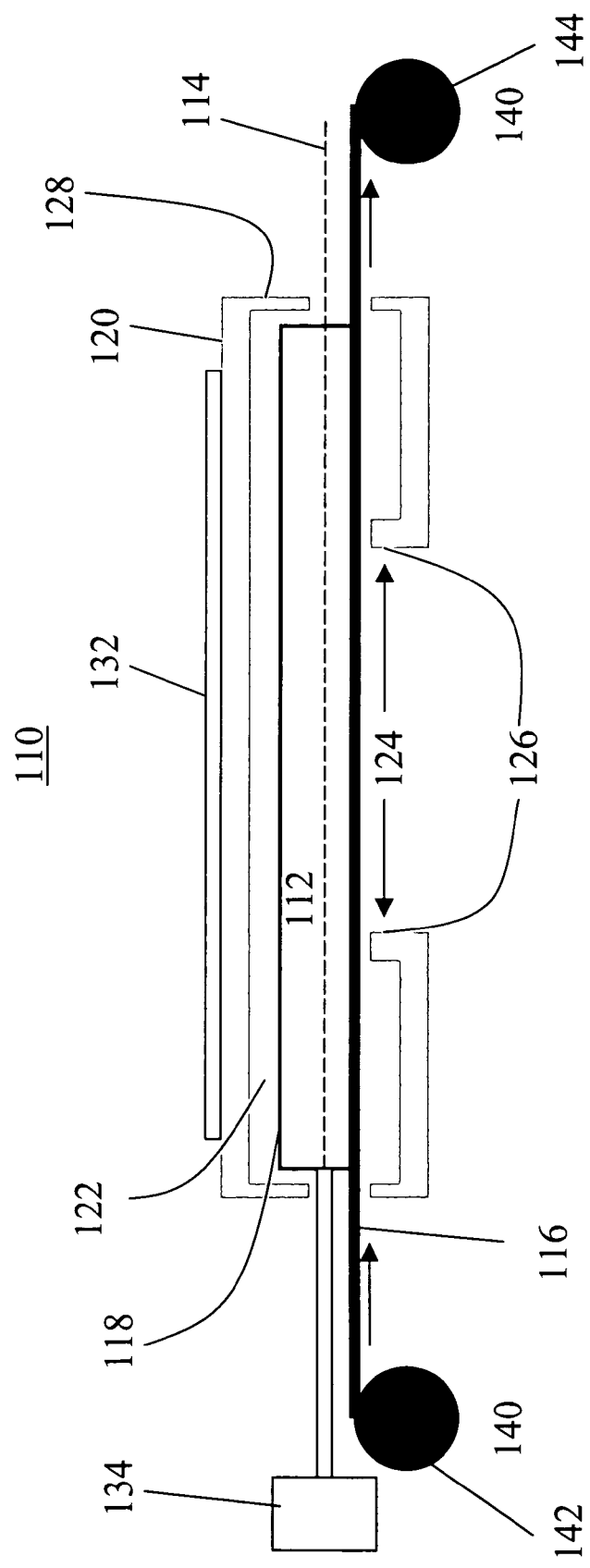
FIG. 2a is a schematic representation of a tape support assembly.

In the following description, like reference characters designate like or corresponding parts throughout the several views shown in the figures. It is also understood that terms such as "top," "bottom," "outward," "inward," and the like are words of convenience and are not to be construed as limiting terms. In addition, whenever a group is described as either comprising or consisting of at least one of a group of elements and combinations thereof, it is understood that the group may comprise or consist of any number of those elements recited, either individually or in combination with each other.

Referring to the drawings in general and to FIG. 1 in particular, it will be understood that the illustrations are for the purpose of describing particular embodiments of the invention and are not intended to limit the invention thereto. Turning to FIG. 1, a schematic representation of a system 100 for coating a tape substrate 116 is shown. System 100 may be used to deposit ceramic materials such as, but not limited to, metal oxides, metal nitrides, metal carbides, metal sulfides, combinations thereof, and the like on tape substrate 116. In a particular embodiment, system 100 is used to form high temperature superconducting (HTS) oxides, such as, but not limited to, cuprate semiconductors, including yttrium barium copper oxide (YBCO) and rare earth YBCO compounds, such as dysprosium yttrium barium copper oxides. In such instances, tape substrate 116 further includes at least one buffer layer such as, but not limited to, magnesium oxide (MgO) and the like. The HTS material is deposited on the buffer layer. In addition, the superconducting compound magnesium diboride $MgB_2$ may be deposited on tape substrate 116 using the system 100 and tape support assembly 110 described herein. Where, for the purpose of describing the invention, the formation of HTS compounds and YBCO are described, it is understood that the systems and methods described herein may also be used to synthesize other ceramic materials, such as inorganic oxides, nitrides, carbides, sulfides, and the like.

System 100 includes a vessel 102 defining a vacuum chamber 104. Using pumps and valve systems that are known in the art, vessel 102 is capable of maintaining vacuum chamber 104 at a pressure of less than about $10^{-3}$ Torr. Tape support assembly 110 and at least one metal vapor source 150 are located within vessel 102.

Tape support assembly 110, shown schematically in FIG. 2a and in perspective in FIG. 2b, comprises a drum 112, which is rotatable around longitudinal axis 114. Although FIGS. 2a and 2b show only a single tape substrate 116, it will be appreciated that drum 112 may accommodate a plurality of tape substrates 116. The actual number of tape substrates 116 that drum 112 may accommodate on its surface 118 is limited at least in part by the width of tape substrate 116 and the radius of drum 112. Drum 112 supports at least one tape substrate 116, which is axially disposed against a surface 118 of drum 112; i.e., tape substrate 116 is disposed along surface 118 such that it is substantially parallel to longitudinal axis 114. Drum 112 is disposed within an annular stator 120 such that a space 122 (also referred to herein as an "oxygen pocket") exists between drum 112 and stator 120 such that drum 112 rotates freely within annular stator 120. At least one gas source (not shown) is in fluid communication with space 122 and provides the reactive gas to space 122. A rotor drive 134 is coupled to drum 112 and rotates drum 112 around longitudinal axis 114 at a predetermined speed. In one embodiment, tape support assembly 110 includes a take-up/pay-out assembly 140 that is co-rotatable with the drum and moves the at least one tape substrate 116 in a direction perpendicular to a direction of rotation of drum 112.

The length of tape substrate 116 that may be coated using system 100 and tape support assembly 110 is not limited by the dimensions of vessel 102, chamber 104, tape support assembly 110, or drum 112. For the purposes of understanding the invention, a "tape substrate" or "tape" is understood to be a substrate having a length and a width, wherein the length is at least 10 times greater than the width. Preferably, the length is at least 100 times greater than the width and, more preferably, the length is at least 1000 times greater than the width. In another embodiment, the length is at least 10,000 times greater than the width. In yet another embodiment, the length of the tape substrate is at least 100,000 times greater than its width.

Figure 3:
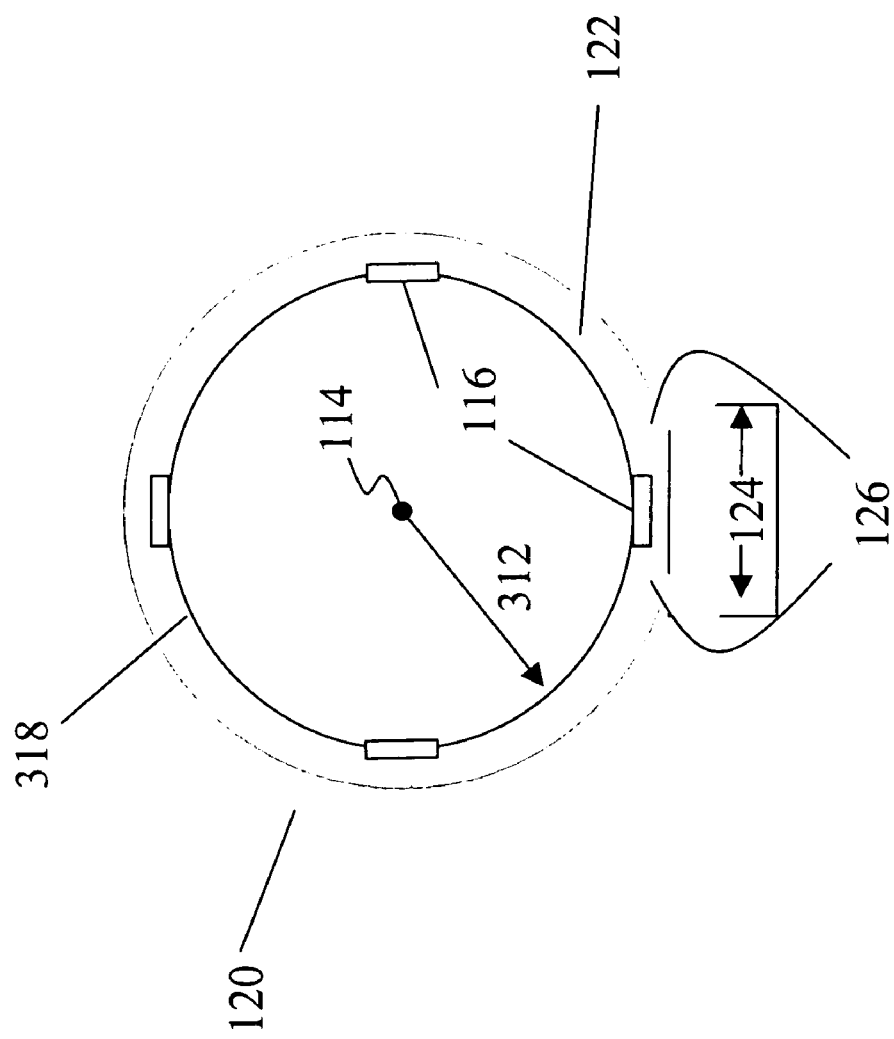
FIG. 3 is a schematic cross-sectional view of a cylindrical drum of the tape support assembly.

In one embodiment, drum 112 is cylindrical. A cross-sectional schematic view of a cylindrical drum 312 is shown in FIG. 3. As seen in FIG. 3, cylindrical drum 312 is rotatable around longitudinal axis 114. Four tape substrates 116 are disposed on surface 318 of cylindrical drum 312. The number of tape substrates 116 that may be disposed on surface 318 is not limited to four; the actual number of tape substrates 116 that cylindrical drum 312 may accommodate on its surface 318 is limited at least in part by the width of tape substrate 116 and the radius 311 of cylindrical drum 312.

Figure 4:
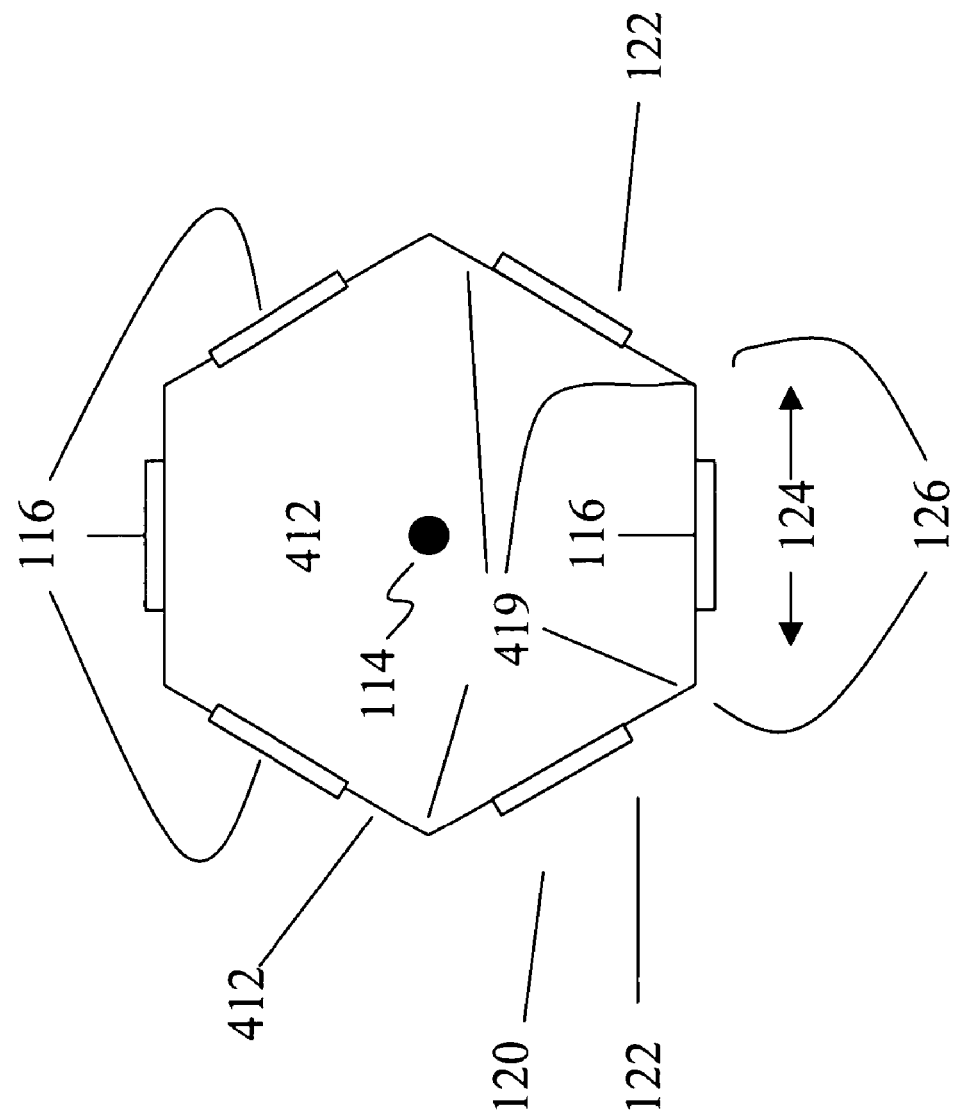
FIG. 4 is a schematic cross-sectional view of a polygonal drum of the tape support assembly.

In a second embodiment, drum 112 has a polygonal cross-section, shown in FIG. 4. Only the portion of annular stator adjacent to slot 124 is shown in FIG. 4; annular stator 120 radially surrounds the remainder of drum 112. Polygonal drum 412 is rotatable around longitudinal axis 114. Whereas polygonal drum 412 has six sides and six tape substrates 116 are disposed on surface 418 in FIG. 4, the actual number of tape substrates 116 that polygonal drum 412 may accommodate on its surface 418 is limited at least in part by the dimensions of tape substrate 116 and polygonal drum 412. Similarly, polygonal drum 412 need not be six-sided, but may have any number of sides. The flat surfaces 418 of polygonal drum 412 assist in tensioning tape substrate 116 and maintaining substrate 116 in a flat position on surface 418.

Figure 5:
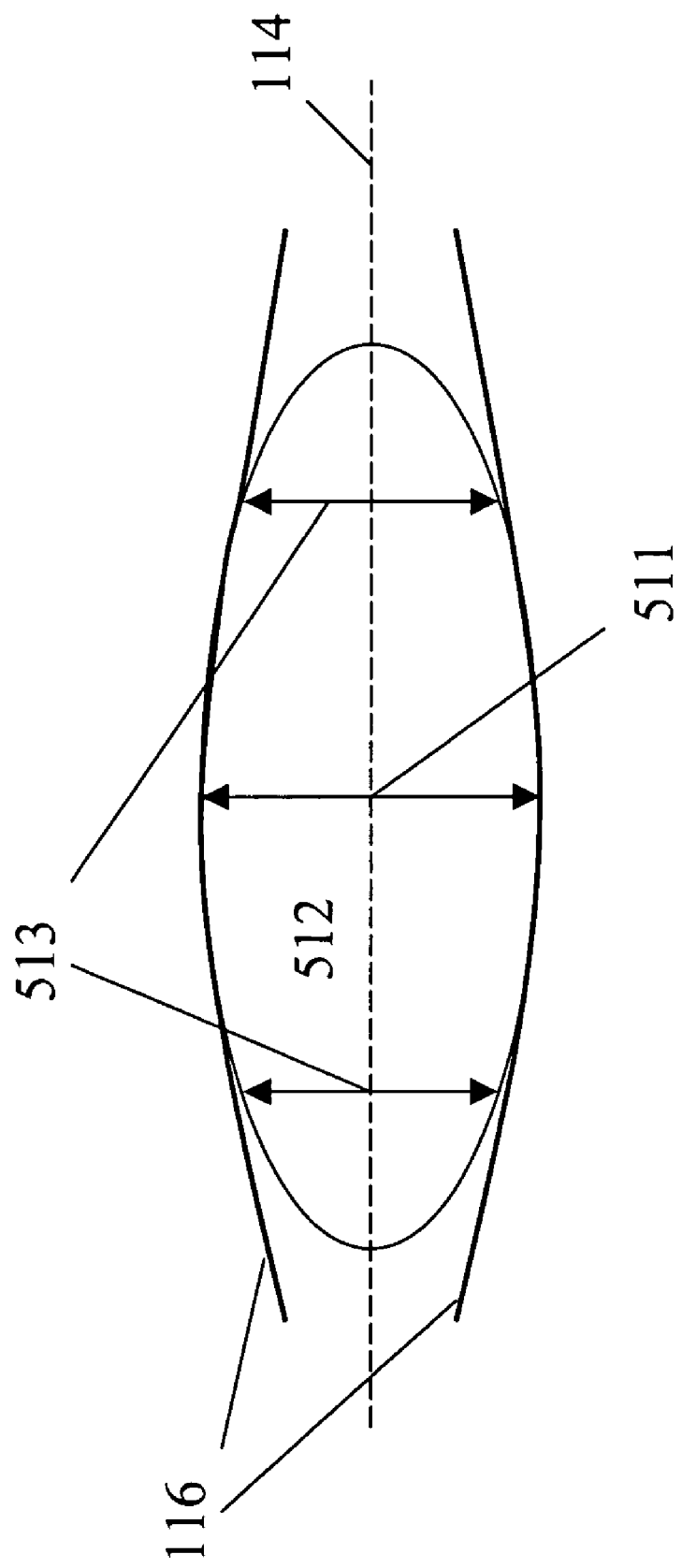
FIG. 5 is a schematic axial cross-sectional view of an ellipsoidal drum of the tape support assembly.

In another embodiment, drum 112 has an elliptical shape. An axial cross-section of an elliptical drum 512 is shown in FIG. 5. Elliptical drum 512 has a first center cross-sectional diameter 511 that is greater than a second cross-sectional diameter 513 at a point removed from the center of the elliptical shape. The difference in diameters 511 and 513 assists in tensioning tape substrate 116 and maintaining tape substrate 116 in a flat position on surface 518. It will be appreciated by those skilled in the art that elliptical drum 512 need not be a pure ellipsoid, but may instead include features that assist in the tensioning and maintaining tape substrate 116 in a flat position. For example, elliptical drum 512 may have a polygonal cross-section, such as that shown in FIG. 4. In another example, the ends of elliptical drum 512 may be truncated. The actual number of tape substrates 116 that elliptical drum 512 may accommodate on its surface 518 is limited at least in part by the dimensions of tape substrate 116 and elliptical drum 512.

Figure 6B:
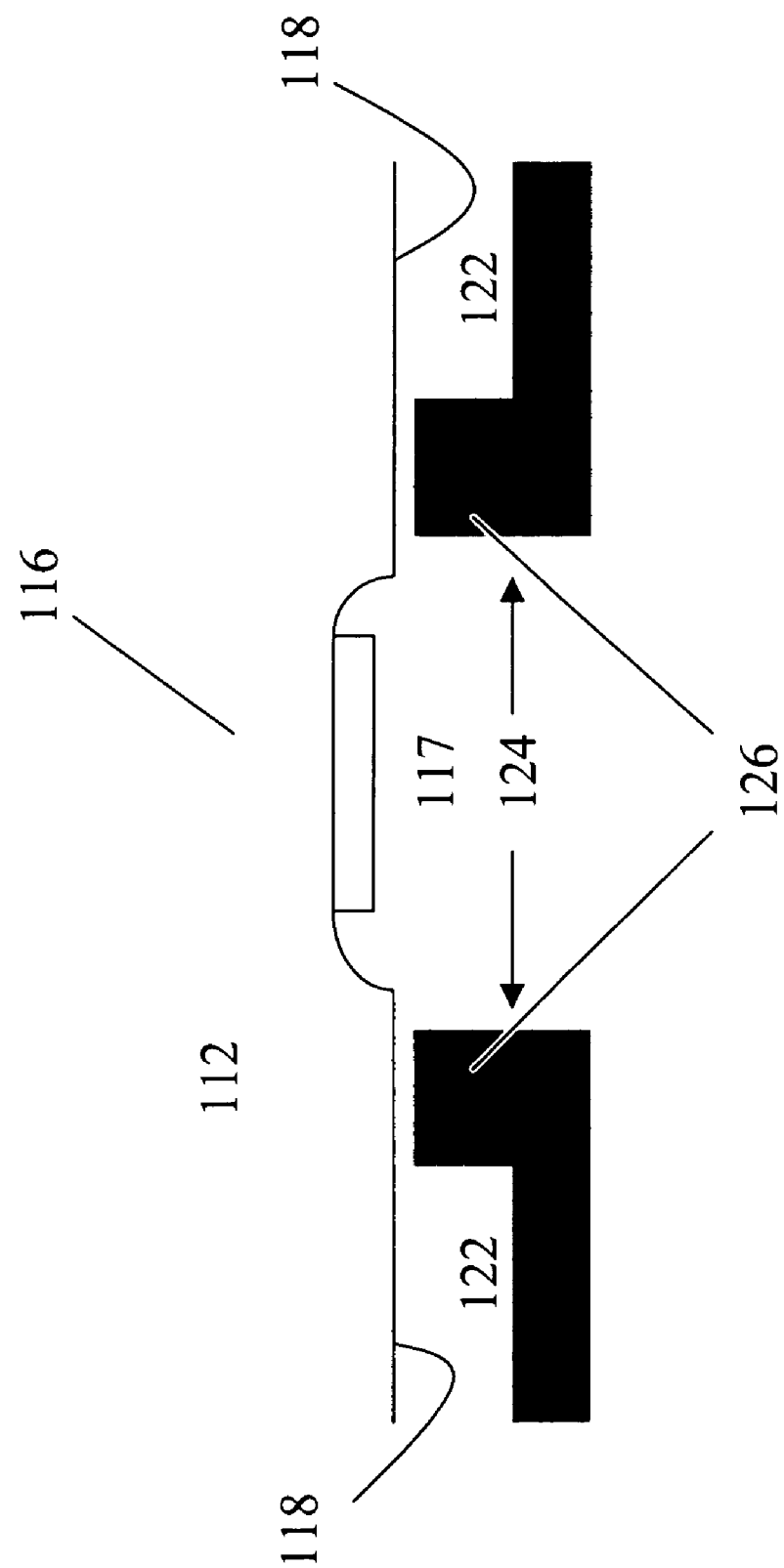
FIG. 6b is a schematic cross-sectional view of a tape substrate disposed in a concave groove of a drum of the tape support assembly.

In one embodiment, drum 112 includes at least one groove 117 in surface 118 for each tape substrate 116 disposed on drum 112 to maintain the flat position of each tape substrate 116 on drum 112. A cross-sectional view of a tape substrate 116 disposed in a rectangular groove 117 is shown in FIG. 6a. Whereas groove 117 in FIG. 6a is rectangular in shape, other profiles, such as, but not limited to, a concave groove, shown in FIG. 6b, or a groove having a dovetailed portion (not shown) may be used. Groove 117 has a width that is sufficient to accommodate tape substrate 116 and deep enough to prevent contact between tape substrate 116 and lip 126 seal of stator 120. At the same time, groove 117 is sufficiently shallow to prevent tape substrate from being "shadowed" from the at least one vapor source 150.

A rotor drive 134 is coupled to drum 112. Rotor drive 134 rotates drum 112 around longitudinal axis 114 at a predetermined speed. Electric drive motors known in the art, such as DC, motors, step motors, servo-motors, and the like may be used in rotor drive 134. Rotor drive 134 may rotate drum continuously or incrementally in a step-wise manner.

Tensioners, such as spring-loaded clips and the like, located on surface 118 or in groove 117, may also be used to tension tape and hold substrate 116 in a flat position on drum 112.

Take-up/pay-out assembly 140 (FIG. 2) includes any mechanism that is capable of providing tape substrate 116 to tape support assembly 110. In one embodiment, take-up/pay-out assembly 140 comprises a pay-out reel 142, which provides each tape substrate 116 to drum 112, and a take-up reel 144, which removes and collects each tape substrate 116 from drum 112 after HTS material has been formed on tape substrate 116 in tape support assembly 110. Pay-out reel 142 and take-up reel 144 may include drive motors (not shown) to "pay-out" or provide tape substrate 116 to tape support assembly 110 and drum 112 and subsequently take up or collect tape 114 substrate at a synchronous rate. Such a take-up/pay-out assembly 140 also includes devices known in the art such as, but not limited to, guides, rollers, spring tensioners, and the like for guiding, tensioning, and positioning tape substrate 116 flat against surface 118 of drum 112.

Take-up/pay-out assembly 140 co-rotates at the same frequency with drum 112. At least a portion of take-up/pay-out assembly 140 may be connected to drum 112 and rotated with drum 112 by rotor drive 134. Alternatively, at least a portion of take-up/pay-out assembly 140 may be rotated independently—but at the same frequency—as drum 112. For example, drum 112 and take-up reel 144 may be connected to each other and rotated at a given frequency by rotor 134, while pay-out reel 142 may be rotated by a separate drive motor at the same frequency as—and synchronous with—drum 112 and take-up reel 144. This arrangement is particularly advantageous when at least one of the pay-out reel 142 and take-up reel 144 are located outside vacuum chamber 104.

Figure 7:
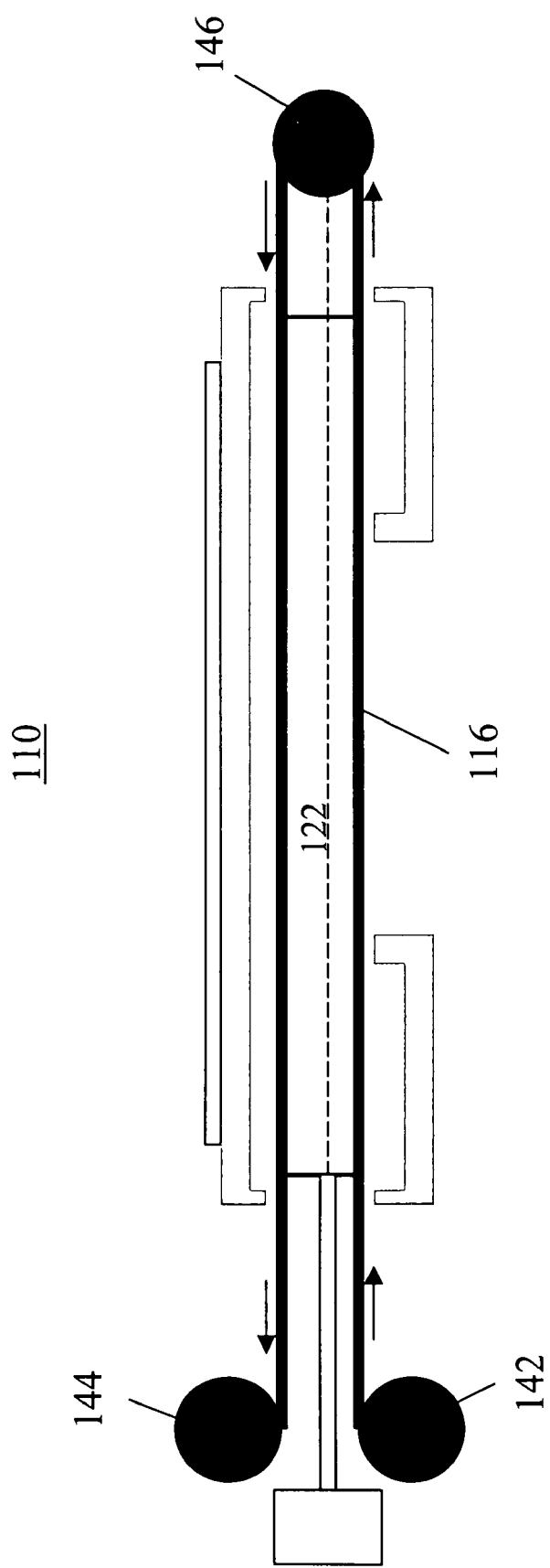
FIG. 7 is a schematic view of the tape support assembly in which the take-up/pay-out assembly includes a turn-around reel.

Pay-out reel 142 and take-up reel 144 may be located at opposite ends of tape support assembly 110 and drum 112, as shown in FIGS. 1, 2a, and 2b. Alternatively, pay-out reel 142 and take-up reel 144 may be located at the same end of tape support assembly 110, as shown in FIG. 7. In this embodiment, take-up/pay-out assembly 140 further includes a turn-around reel 146, located at an end of tape support assembly opposite pay-out reel 142 and take-up reel 144. Here, pay-out reel 142 provides tape substrate 116, which moves in a first direction through tape support assembly 110, where HTS material is formed on tape substrate 116, to turn-around reel 146. Passing through turn-around reel 146, the direction of travel of tape substrate 116 is reversed, and tape substrate passes through tape support assembly 110 once more, where additional HTS material may be formed on tape substrate 116, to take-up reel 144, where tape substrate 116 is collected.

Figure 2C:
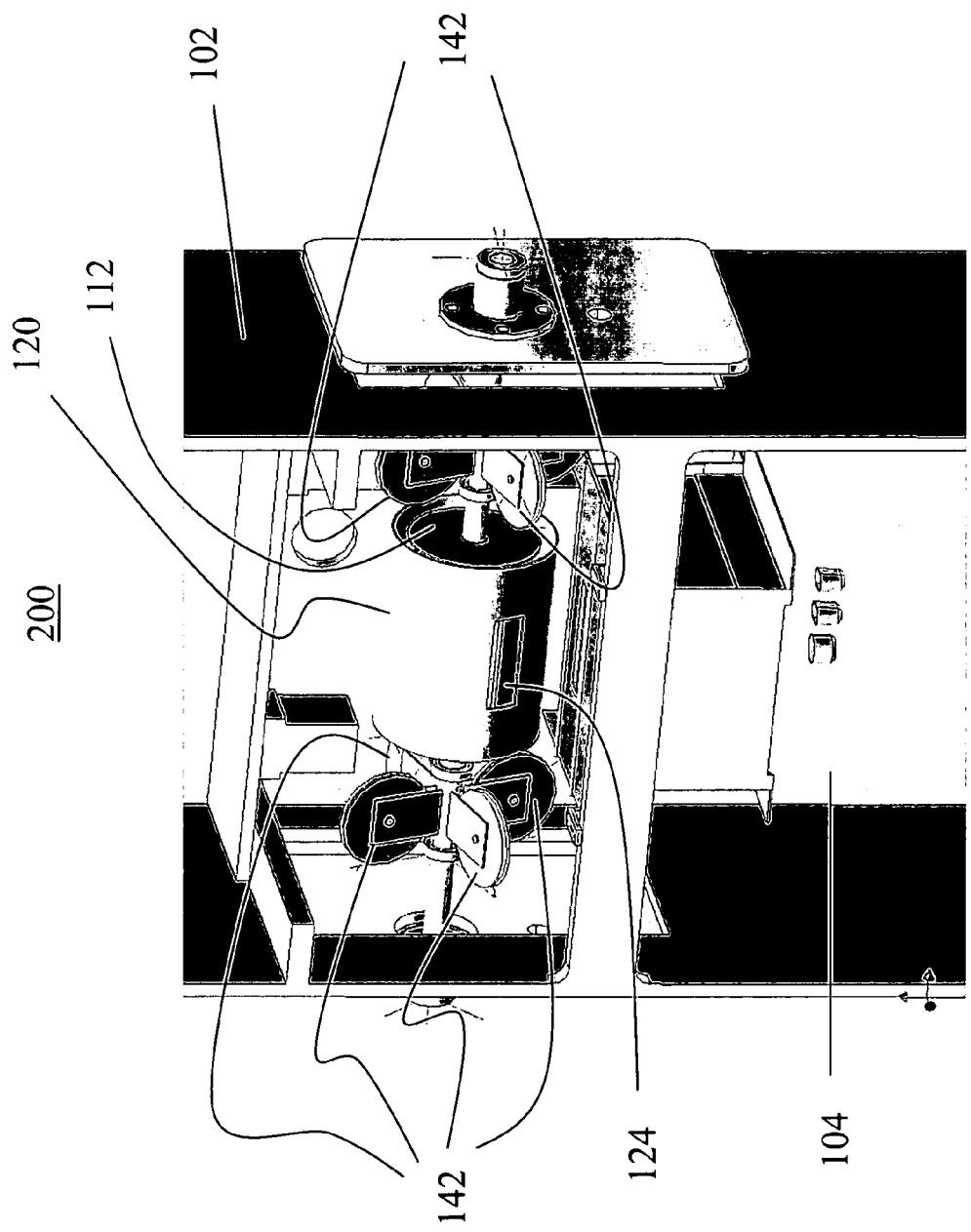
FIG. 2c is a perspective view of the system for coating a tape substrate.

One take-up/payout system 140 is provided for each tape substrate 116. Although only a single tape substrate 116 and take-up/payout system 140 are depicted in FIGS. 2a and 2b, tape support assembly 110 and system 100 may accommodate additional tape substrates and the accompanying take-up/payout systems 140. FIG. 2c shows a perspective view of one embodiment 200 of system 100 that is adapted to accommodate four tape substrates 116. Accordingly, system 200 includes a pay-out reel 142 and take-up reel 144 for each tape substrate. It should also be noted that, in FIG. 2c, stator 120 is rotated so that slot 124 is visible. The actual number of take-up/payout systems 140 included in tape support assembly 110 is limited at least in part by the width of tape substrate 116 and radius of drum 112.

At least a portion of take-up/pay-out system 140 may be located outside vacuum chamber 104. In order to maintain the pressure within vacuum chamber at the pressure necessary to deposit HTS materials on tape substrate 116, various means known in the art such as, but not limited to, baffles, vacuum feed-throughs, seals, flanges, and the like may be located in the path of travel of tape substrate 116 from tape support assembly 110 to the portion of take-up/pay-out system 140 that is located outside vacuum chamber 104.

Annular stator 120 includes at least one slot 124 extending through annular stator 120, exposing a portion of drum 112 and the at least one tape substrate 116, as shown in FIGS. 1-4. Slot 124 is oblong (i.e., having a length that is greater than its width) and preferably rectangular in shape, with its length parallel to longitudinal axis 114 of drum 112. A lip seal 126, shown in FIGS. 1-4, disposed around the edge of slot 124, and end seals 128 disposed at each end of annular stator 120, shown in FIGS. 1-2, allow space 122 to be maintained at a pressure that is greater than the pressure in vacuum chamber 104.

Drum 112 is located within annular stator so as to create space 122 between annular stator 120 and drum 112. A reactive gas is provided at a predetermined pressure to space 122 by a gas source (not shown) through at least one inlet located in any one of the annular stator 120, end seals 128, and drum 112. In one embodiment, the predetermined pressure is in a range from about 1 mTorr to about 1 Torr. For the formation of HTS oxide materials, the reactive gas is oxygen. To form nitrides, nitrogen is selected as the reactive gas. Similarly, acetylene may be used to form carbides. For the formation of $MgB_2$, the reactive gas in space 122 comprises magnesium vapor while boron vapor is provided by the at least one metal vapor source 150.

To form the HTS material on tape substrate 116, the oxygen present space 122, tape substrate 116, and the metals deposited thereon must be heated to a predetermined temperature. At least one heating element 130 is provided to at least one of drum 112, space 122, or annular stator 120. The at least one heating element 130 heats drum 112, stator 120, and space 122. Thus, as drum 112 rotates, tape substrate 116 passes through an enclosed, isothermal black body radiator. For the formation of HTS materials, this isothermal heating of tape substrate 116 promotes the formation of the superconducting phase. The actual predetermined temperature and pressure depend upon the phase diagram of the ceramic material to be formed. For the formation of YBCO, for example, the predetermined oxygen pressure ($PO_2$) is in a range from about 0.01 Torr (10 mTorr) to about 1 Torr, and the predetermined temperature is in a range from about 600° C. to about 900° C.

Typically, the partial pressure of the reactive gas within space 122 is about 5 to about 1000 times greater than the total pressure of chamber 104. In order to maintain the pressure differential between space 122 and vacuum chamber 102, it is desirable for a portion of lip seal 126 to either contact or come into close proximity with surface 118 of drum 112. To accomplish this, lip seal 126 may comprise any one of those sealing mechanisms used for moving machinery and parts that are known in the art. For example, lip seal 126 may comprise a tortuous path, a brush seal, a spring-loaded seal, or the like, either individually or in combination with each other. In one embodiment, lip seal 126 is an abradable seal comprising an abradable material, such as, but not limited to, boron nitride. Here, the abradable portion maintains the pressure differential by contacting surface 118, and abrading away with continued rotation. In another embodiment, lip seal 126 includes at least one orifice coupled to a vacuum pumping system. The orifice is located at a surface of lip seal 126 that is proximate to surface 118. When the pumping system generates a vacuum, suction through the orifice narrows—and, in some instances, closes—the gap between lip seal 126 and surface 118. End seals 128 as well may employ of the sealing mechanisms described hereinabove.

When used in conjunction with lip seal 126, features of drum 112, previously described herein, act to maintain the pressure differential between space 122 and vacuum chamber 104. For example, corners 419 of polygonal drum 412 cooperate with lip seal 126 to seal space 122, as seen in FIG. 4. Groove 117 allows tape substrate 116 to be disposed on drum 112 below the plane of surface 118, thereby allowing lip seal 126 to contact surface 118 during rotation of drum without damaging tape substrate 116.

Better contact between lip seal 126 and surface 118 may also be obtained by either moving annular stator 120 or altering its shape. In one embodiment, annular stator 120 is movable with respect to longitudinal axis 114 of drum 112. In another embodiment, the diameter of annular stator 120 may be adjusted by deforming annular stator.

Both drum 112 and annular stator 120 must be resistant to reaction with the reactive gas in the temperature range at which formation of the ceramic material takes place on tape substrate 116. Drum 112 and annular stator 120 are typically made from superalloys such as, but not limited to, iron- and nickel-based superalloys.

At least one metal vapor is provided to a portion of tape substrate 116 through slot 124 by at least one metal vapor source 150, which is disposed in vacuum chamber 104. The at least one metal vapor condenses on the portion of tape substrate 116. For the HTS material YBCO, the at least one metal vapor source provides vapors of yttrium, barium, and copper to the at least one buffer layer on tape substrate 116. Upon rotation of drum 112, the portion of tape substrate 116 enters space 122, where the metal deposited on tape substrate 116 reacts with the reactive gas present in space 122 to form the HTS material.

Preferably, the at least one metal vapor source 150 comprises a thermal evaporation system. The thermal evaporation system uses either electron beam or thermally (resistance or induction) heated sources to vaporize the metal and generate the at least one metal vapor. Evaporation is desirable because it is a potentially high throughput and, therefore, scalable technology with broad area deposition and high rate of film formation. The high throughput is necessary for a commercially viable process.

Other means of providing a metal vapor that are known in the art may be utilized as the at least one metal vapor source 150. For example, the at least one metal vapor source may include a pulsed laser deposition system in which material is deposited directly from at least one metal vapor source using vaporization by a pulsed laser beam, or a sputtering system. Metallorganic chemical vapor deposition (MOCVD), in which a metal coating is deposited from a metallorganic gaseous source using chemical vapor deposition, may also be used. System 100 may incorporate more than one of such means to provide metal vapor to tape substrate 116.

The invention also provides a method of making a metal oxide or a metal nitride on a tape substrate 116, such as a high temperature superconducting oxide. Although a method of making a HTS oxide is described herein, it is understood that the method applies to making other metal oxides and metal nitrides as well.

First, at least one tape substrate 116 is provided and disposed on drum 112 so that the length of tape substrate 116 is parallel to the longitudinal axis (or axis of rotation) 114 of drum 112. In one embodiment, tape substrate 116 includes at least one buffer layer deposited on a surface. In one embodiment, each tape substrate 116 is provided to drum 112 by a pay-out reel 142, which co-rotates with drum 112. As previously described, the actual number of tape substrates 116 that drum 112 may accommodate on surface 118 is limited at least in part by the width of tape substrate 116 and the dimensions of drum 112. A predetermined partial pressure of oxygen is then provided to space 122. Space 122 and tape substrate 116 are then heated to a predetermined temperature. The actual partial pressure of oxygen and the predetermined temperature depend upon the phase diagram of the HTS material to be formed.

Drum 112 is rotated to align tape substrate 116 with slot 124, exposing tape substrate 116 to at least one metal vapor provided by at least one metal vapor source 150. The metal vapor passes through slot 124 and condenses in elemental form on the portion of tape substrate 116 that is exposed through slot 124. In those embodiments in which tape substrate 116 includes a buffer layer deposited on a surface, the metal vapor is deposited on the buffer layer. For YBCO, the at least one metal vapor comprises yttrium, barium, and copper vapors. As previously described herein, the at least one metal vapor my be generated by any one of thermal or electron beam evaporation, sputtering, pulsed laser deposition, metallorganic chemical vapor deposition, and the like.

During the deposition process, drum 112 rotates either continuously or in a step-wise manner. As drum 112 rotates, the portion of tape substrate 116, onto which the at least one metal has been deposited while the substrate was in alignment with slot 124, moves into space 122. Oxygen present within space 122 reacts with the at least one metal on tape substrate 116 to form HTS material. Additional HTS material may be formed on tape substrate 116 by continuing to rotate drum 112 so that the same portion of tape substrate 116 is again exposed to the at least one metal vapor through slot 124 to deposit additional metal and then exposed to oxygen in space 122 to convert the additional metal to the HTS oxide.

The amount and composition of HTS material that is formed by the method may also be adjusted by changing the width of slot 124. The change in width of slot 124 changes the ratio of the residence time of tape substrate 116 in slot 124 to the residence time in space 122. If this ratio is increased, for example, more metal would be deposited on tape substrate 116 and a lesser amount of oxygen would react with the deposited metal in each rotation of drum 112, resulting in lower oxygen content in of the deposited oxide. The rotational speed or frequency of drum 112 may also be used to adjust the amount of material formed during each rotation.

Once the desired amount of HTS material is formed on the portion of tape substrate 116, take-up reel 146 collects the portion and a second portion of tape substrate 116 that has not been exposed to the at least one metal vapor is advanced from pay-out reel 144 to drum 112. HTS material is then formed on the second portion of tape substrate 116, the second portion is the collected, and a third portion of tape substrate is provided to drum 112.

In one embodiment, the portion of tape substrate onto which HTS material has been formed passes through turnaround reel 146 (FIG. 7), where the direction of travel of tape substrate 116 is reversed. Tape substrate 116 then passes through tape support assembly 110 and is provided to drum 112 once more, where additional HTS material may be formed on tape substrate 116, before passing to take-up reel 144, where tape substrate 116 is collected.

Unlike those techniques currently used to manufacture HTS tapes, the present invention allows HTS tapes of lengths that are much greater than the dimensions of the coating apparatus to be manufactured, and eliminates the need for a large drum or mandrel and vacuum vessels for making long lengths of tape. In addition, the invention is capable of simultaneously coating multiple tape substrates, thus providing a dramatic increase in manufacturing throughput. The take-up/pay-out system allows the uncoated tape substrate and finished tape to be handled more efficiently than is possible when the tape is helically wound around a mandrel.

FIG. 8 is a table showing expected operational parameters and output for system 100 and tape support assembly 110 for the formation of YBCO on tape substrate 116. Parameters are listed for cylindrical drums having a diameter of either 15 cm or 150 cm. Drums of both sizes are capable of handling multiple tape substrates. The 15 cm diameter drum can accommodate 20 tape substrates, each tape substrate having a 1 cm width, whereas the 150 cm drum can accommodate 250 tape substrates of the same width. The tape substrates need not be limited to 1 cm. For example, a 150 cm diameter drum may accommodate 12 tape substrates, each 20 cm wide, that may be coated and subsequently divided or cut into narrower strips.

The dimensions of the deposition zone are based upon the length and width of slot 124. Depending on the rotational speed and deposition rate, a layer comprising yttrium, barium, and copper of a desired thickness is deposited on each tape substrate 116 with each revolution. Deposition rate can be controlled by adjusting the parameters associated with the at least one vapor source 150. Such parameters include, but are not limited to, the temperature at which thermal evaporation takes place and the power of an electron beam or sputtering source that is used to generate the at least one metal vapor. For the formation of YBCO, it is desirable to limit the thickness of the deposit to less than the length of a unit cell (about 12 Å). Accordingly, the examples listed in FIG. 8 have thicknesses of 2 Å and 6 Å deposited with each revolution.

The speed at which take-up/pay-out system 140 ("Individual Tape speed" in FIG. 8) moves tape substrate 116 from pay-out reel 142 over surface 118 of drum 112 to take-up reel 144 may also be used to obtain a desired total thickness ("Deposit per Pass" in FIG. 8) and output—that is, the area of tape substrate 116 that is actually coated per unit time. The output is expressed in FIG. 8 in terms of the combined effective speed, or meters of 1 cm tape processed each hour.

The interrelationship of the various parameters and their effect upon the output of coated tape substrate are seen in FIG. 8. A greater combined effective speed is achievable with a 150 cm drum than a 15 cm drum because of the capability to accommodate a larger number of tape substrates. Comparing the parameters given for the 150 cm drum, increasing the amount deposited per revolution allows the individual tape speed to be increased, thereby producing a greater combined effective speed.

While typical embodiments have been set forth for the purpose of illustration, the foregoing description should not be deemed to be a limitation on the scope of the invention. Accordingly, various modifications, adaptations, and alternatives may occur to one skilled in the art without departing from the spirit and scope of the present invention.

The invention claimed is:

1. A system for coating a tape substrate with a ceramic material, the system comprising:
    a) a vessel defining a vacuum chamber therein, wherein the vessel maintains the vacuum chamber at a pressure of less than $10^{-3}$ Torr;
    b) a tape support assembly at least partially disposed within the vessel, the tape support assembly comprising:
        i) a drum rotatable about a longitudinal axis, wherein the drum is adapted to support at least one tape substrate axially disposed against a surface of the drum;
        ii) an annular stator, wherein the drum is disposed within the annular stator so as to create a space between the annular stator and the drum, the annular stator comprising: at least one slot cut therethrough, wherein the slot is axially aligned with the drum; a lip seal disposed around the edge of the slot and an end seal disposed at each end of the annular stator to allow the space to be maintained at a pressure that is greater than the pressure in the chamber;
        iii) at least one gas source, wherein the at least one gas source is in fluid communication with the space, wherein the gas source provides at least one reactive gas to the space;
        iv) at least one heating element disposed in at least one of the drum, the annular stator, and the space, wherein the at least one heating element heats the at least one tape and gases within the space; and
        v) a rotor drive coupled to the drum, wherein the rotor drive rotates the drum at a predetermined speed; and
    c) at least one metal vapor source disposed in the vacuum chamber, wherein the at least one metal vapor source provides a metal vapor through the slot to the at least one tape substrate supported by the drum.

2. The system according to claim 1, further comprising a take-up/pay-out assembly coupled to the drum, wherein the take-up/pay-out assembly is co-rotatable with the drum, and wherein the take-up and payout system moves the at least one tape substrate in a direction perpendicular to a direction of rotation of the drum.

3. The system according to claim 2, wherein the take-up/pay-out assembly comprises at least one pay-out reel and at least one take-up reel, wherein the pay-out reel provides the tape substrate to the drum and the take-up reel removes the tape substrate after coating and collects the tape substrate, the tape substrate moving from the pay-out reel through the tape support assembly to the take-up reel.

4. The system according to claim 3, wherein the pay-out reel and the take-up reel are located at opposite ends of the drum.

5. The system of claim 3, wherein the rotor drive rotates at least one of the take-up reel and the pay-out reel.

6. The system according to claim 2, wherein the take-up/pay-out assembly tensions the tape substrate flat against the drum.

7. The system according to claim 2, wherein at least a portion of the take-up/pay-out assembly is located outside the vacuum chamber.

8. The system according to claim 1, further comprising at least one tensioner for holding the tape substrate flat against the surface of the drum.

9. The system according to claim 1, wherein the drum is cylindrical.

10. The system according to claim 1, wherein the drum has a polygonal cross-section.

11. The system according to claim 1, wherein the drum is ellipsoidal.

12. The system according to claim 1, wherein the surface of the drum includes at least one groove for positioning the tape substrate.

13. The system according to claim 12, wherein the at least one groove includes a dovetailed groove.

14. The system according to claim 1, wherein the stator is movable with respect to the longitudinal axis of rotation of the drum.

15. The system according to claim 1, wherein the stator has a diameter that is adjustable.

16. The system according to claim 1, wherein the lip seal includes at least one orifice coupled to a pumping system that differentially pumps a region between the lip seal and the drum to locally reduce a pressure therebetween, thereby decreasing separation between the lip seal and the drum.

17. The system according to claim 1, wherein the lip seal is abradable.

18. The system according to claim 1, wherein the lip seal includes a tortuous path.

19. The system according to claim 1, wherein the lip seal is a brush seal.

20. The system according to claim 1, wherein the lip seal is a spring seal.

21. The system according to claim 1, wherein the rotor drive includes an electric motor coupled to the drum.

22. The system according to claim 1, wherein the rotor drive provides incrementally rotates the drum.

23. The system according to claim 1, wherein the rotor drive continuously rotates the drum.

24. The system according to claim 1, wherein the at least one gas source includes at least one of an oxygen gas source and a nitrogen gas source.

25. The system according to claim 1, wherein the at least one metal vapor source comprises at least one of an electron beam evaporation system, a sputtering system, a thermal evaporation system, and a gaseous metal precursor source.

26. A tape support assembly for converting a metal coating on a tape substrate to a ceramic material, the tape support assembly comprising:
   a) a drum rotatable about a longitudinal axis, wherein the drum is adapted to support at least one tape substrate axially disposed against a surface of the drum;
   b) an annular stator, wherein the drum is disposed within the annular stator so as to create a space between the annular stator and the drum, the annular stator comprising: at least one slot cut therethrough, wherein the slot is axially aligned with the drum; a lip seal disposed around the edge of the slot and an end seal disposed at each end of the annular stator to allow the space to be maintained at a pressure that is greater than a pressure outside the annular stator;
   c) at least one gas source, wherein the at least one gas source is in fluid communication with the space, wherein the gas source provides at least one reactive gas to the space;
   d) at least one heating element disposed in at least one of the drum, the annular stator, and the space, wherein the at least one heating element heats the at least one tape and gases within the space; and
   e) a rotor drive coupled to the drum, wherein the rotor drive rotates the drum at a predetermined speed.

27. A system for coating a tape substrate with a ceramic material, the system comprising:
   a) a vessel capable defining a vacuum chamber therein, wherein the vessel maintains the vacuum chamber at a pressure of less than $10^{-3}$ Torr;
   b) a tape support assembly at least partially disposed within the vessel, the tape support assembly comprising:
      i) a drum rotatable about a longitudinal axis, wherein the drum is adapted to support at least one tape substrate axially disposed against a surface of the drum;
      ii) an annular stator, wherein the drum is disposed within the annular stator so as to create a space between the annular stator and the drum, the annular stator comprising: at least one slot cut therethrough, wherein the slot is axially aligned with the drum; a lip seal disposed around the edge of the slot and an end seal disposed at each end of the annular stator to allow the space to be maintained at a pressure that is greater than the pressure in the chamber;
      iii) at least one oxygen source, wherein the at least one gas source is in fluid communication with the space, wherein the gas source provides at least one reactive gas to the space;
      iv) at least one heating element disposed in at least one of the drum, the annular stator, and the space, wherein the at least one heating element heats the at least one tape and gases within the space; and
      vi) a rotor drive coupled to the drum, wherein the rotor drive rotates the drum at a predetermined speed; and
      vii) a take-up/pay-out assembly coupled to the drum, wherein the take-up/pay-out assembly is co-rotatable with the drum, and wherein the take-up/pay-out assembly moves the at least one tape substrate in a direction perpendicular to a direction of rotation of the drum; and
   c) at least one metal vapor source disposed in the vacuum chamber, wherein the at least one metal vapor source provides a metal vapor through the slot to the at least one tape substrate supported by the drum.

* * * * *